United States Patent
Odegard et al.

(10) Patent No.: US 6,855,578 B2
(45) Date of Patent: Feb. 15, 2005

(54) VIBRATION-ASSISTED METHOD FOR UNDERFILLING FLIP-CHIP ELECTRONIC DEVICES

(75) Inventors: Charles A. Odegard, McKinney, TX (US); Willmar E. Subido, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 19 days.

(21) Appl. No.: 10/222,245

(22) Filed: Aug. 16, 2002

(65) Prior Publication Data

US 2004/0033643 A1 Feb. 19, 2004

(51) Int. Cl.$^7$ ............................................. H01L 21/48
(52) U.S. Cl. ...................................... 438/120; 438/127
(58) Field of Search ............................ 438/120, 127, 438/106, 108, 112, 124–126

(56) References Cited

U.S. PATENT DOCUMENTS 6,261,501 B1 * 7/2001 Miyagawa et al. ..... 264/272.15
6,437,450 B1 * 8/2002 Baba et al. ................. 257/778
6,564,988 B1 * 5/2003 Shiraishi et al. ......... 228/110.1

* cited by examiner

*Primary Examiner*—Evan Pert
(74) *Attorney, Agent, or Firm*—Yingsheng Tung; Wade James Brady, III; Frederick J. Telecky, Jr.

(57) ABSTRACT

A semiconductor assembly comprising an integrated circuit chip with a first plurality of metallic contact pads exposed, having a pitch center-to-center of less than 180 $\mu$m. A metallic bump of reflowable metal is attached to each of these contact pads. The assembly further has an electrically insulating substrate with a second plurality of metallic terminal pads in locations matching the locations of the contact pads. Each of the bumps also attached to these matching terminal pads, respectively, whereby the chip is interconnected with the substrate spaced apart by a gap. An adherent polymeric encapsulant fills the gap so that the encapsulant is free of voids.

It is a pivotal feature in the method that vibration energy, up to ultrasonic frequencies, is used while the encapsulant is still in a low-viscosity precursor state in order to ensure the void-free spreading of the precursor throughout the gap between chip and substrate. The vibration energy ensures uniform underfill distribution even when the gap and the bump pitch are narrow, with uniform distribution of any fillers, and enhanced adhesion to chip, substrate and bumps.

6 Claims, 4 Drawing Sheets

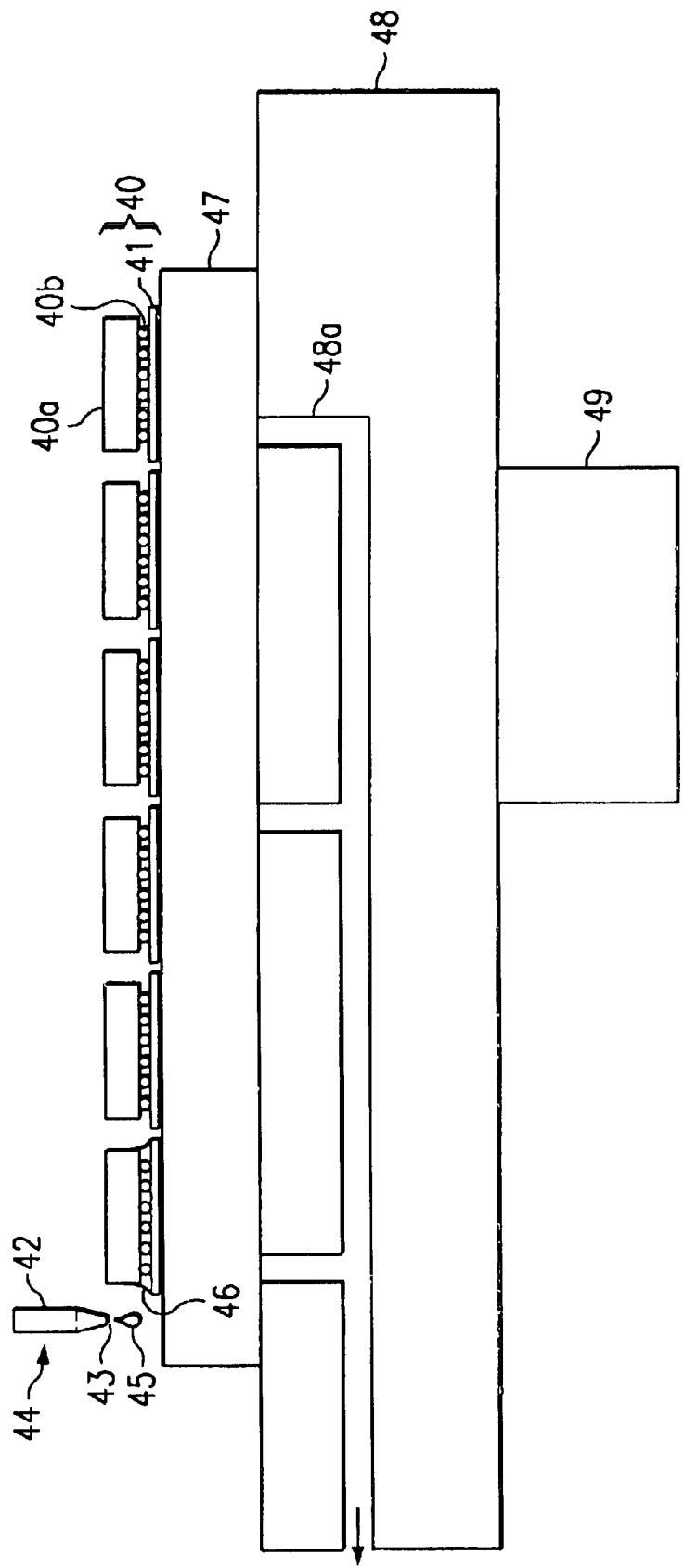

VIBRATION-ASSISTED METHOD FOR UNDERFILLING FLIP-CHIP ELECTRONIC DEVICES

FIELD OF THE INVENTION

The present invention is related in general to the field of electronic systems and semiconductor devices and more specifically to the method of void-free underfilling the gap of flip-chip electronic assemblies.

DESCRIPTION OF THE RELATED ART

It is known to mount an integrated circuit chip to a printed circuit substrate by solder bump interconnections. The integrated circuit chip is spaced apart from the printed circuit substrate by a gap. The solder bump interconnections extend across the gap and connect contact pads on the integrated circuit chip to terminal pads on the printed circuit substrate to attach the chip and then conduct electrical signals, power and ground potential to and from the chip for processing. There is a significant difference between the coefficient of thermal expansion (CTE) between the semiconductor material used for the chip and the material typically used for the substrate; for instance, with silicon as the semiconductor material and plastic FR-4 as substrate material, the difference in CTE is about an order of magnitude.

As a consequence of the CTE difference, mechanical stresses are created when the assembly is subjected to thermal cycling during use or testing. These stresses tend to fatigue the solder bump interconnections, resulting in cracks and thus eventual failure of the assembly. In order to strengthen the solder joints without affecting the electrical connection, the gap is customarily filled with a polymeric material which encapsulates the bumps and fills any space in the gap between the semiconductor chip and the substrate. For example, in the well-known "C-4" process developed by the International Business Machines Corporation, polymeric material is used to fill any space in the gap between the silicon chip and the ceramic substrate (see also IBM J. Res. Develop., vol. 13, pp. 226–296, 1969).

The encapsulant is typically applied after the solder bumps are reflowed to bond the integrated circuit chip to the printed circuit substrate. A polymeric precursor, sometimes referred to as the "underfill", is dispensed onto the substrate adjacent to the chip and is pulled into the gap by capillary forces. The precursor is heated, polymerized and "cured" to form the encapsulant. It is well known in the industry that the elevated temperature and the temperature cycling needed for this curing can also create mechanical stresses which can be detrimental to the chip and the solder interconnections. The stresses may delaminate the solder joint, crack the passivation of the chip, or propagate fractures into the circuit structures.

Recent successful approaches to minimize thermomechanical stress during the fabrication of the chip/substrate assembly have been described in the U.S. Pat. No. 6,213,347, issued Apr. 10, 2001 (Thomas, "Low Stress Method and Apparatus of Underfilling Flip-Chip Electronic Devices"); U.S. Pat. No. 6,228,680, issued May 8, 2001 (Thomas); and U.S. Pat. No. 6,245,583, issued Jun. 12, 2001 (Amador). These approaches become increasingly insufficient as the number of bump interconnections increases and the bump size and the bump center-to-center pitch shrink. With these trends, the number of voids in the underfill and the risk of clustering the fillers in the precursor increase sharply; in addition, the adhesion of the underfill to the chip, substrate, and bumps degrades.

An urgent need has therefore arisen for an assembly methodology, material selection and fabrication technique that provide not only stress-free, but also void-free underfilling. The assembly process should be simple and low-cost, applicable to large-chip semiconductor products, high numbers and small size of bumps, and fine bump pitch. At the same time, the method should be flexible to be applied to a wide spectrum of material and process variations, leading to improved semiconductor device reliability. Preferably, these improvements should be accomplished using the installed equipment base so that only little investment in new manufacturing machines is needed.

SUMMARY OF THE INVENTION

A semiconductor assembly is described comprising an integrated circuit chip with a first plurality of metallic contact pads exposed, having a pitch center-to-center of less than 180 $\mu$m. A metallic bump of reflowable metal is attached to each of these contact pads. The assembly further has an electrically insulating substrate with a second plurality of metallic terminal pads in locations matching the locations of the contact pads. Each of the bumps is attached to these matching terminal pads, respectively, whereby the chip is interconnected with the substrate spaced apart by a gap. An adherent polymeric encapsulant fills the gap so that the encapsulant is free of voids.

It is a pivotal feature in the method of the present invention that vibration energy, up to ultrasonic frequencies, is used while the encapsulant is still in a low-viscosity precursor state in order to ensure the void-free spreading of the precursor throughout the gap between chip and substrate. The vibration energy ensures uniform underfill distribution even when the gap and the bump pitch are narrow, with uniform distribution of any fillers, and enhanced adhesion to chip, substrate and bumps.

It is an aspect of the present invention that the methodology is flexible with regard to selecting the vibration energy as a function of precursor material, operating temperature, and time to completion. The method can easily be expanded to batch processing.

Another aspect of the invention is to provide a methodology for a wide range of plastic ball-grid array and chip-scale packages.

It is a technical advantage of the present invention that a wide variety of solder alloys and reflow temperatures can be employed for the stress-reduced packages.

Another technical advantage is the possibility to apply the new methodology to plastic assembly boards with solder bumps for a wide variety of applications.

Other technical advantages of the present invention include an improved reliability of the assembled device.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 4 shows schematically the underfilling arrangement and method with a single dispensing nozzle.

DETAILED DESCRIPTION OF THE PREFERRED EMBODIMENTS

The present invention is related to U.S. Pat. No. 6,213,347, issued Apr. 10, 2001, and U.S. Pat. No. 6,228,680, issued May 8, 2001 (both Thomas, "Low Stress Method and Apparatus for Underfilling Flip-Chip Electronic Devices"); and U.S. Pat. No. 6,245,583, issued Jun. 12, 2001 (Amador et al., "Low Stress Method and Apparatus of Underfilling Flip-Chip Electronic Devices"). These patents are herewith incorporated by reference.

Figure 1:
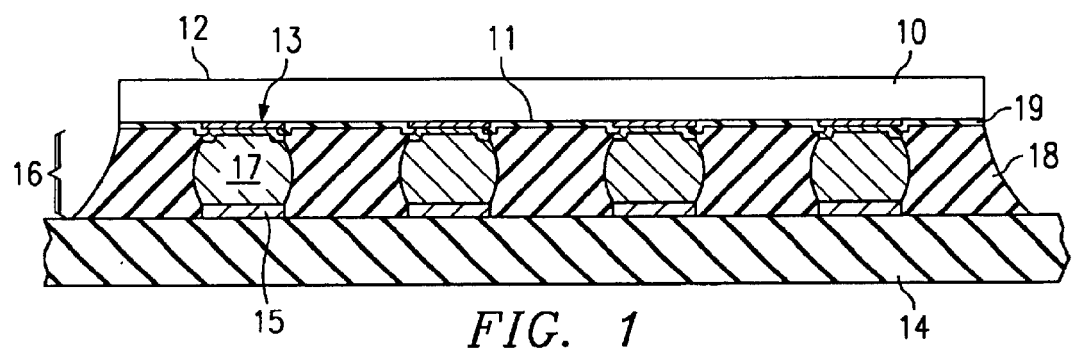
FIG. 1 is a simplified and schematic cross section of an integrated circuit chip attached to a substrate using solder bumps, with the gap between chip and substrate filled with a polymeric filler.

The present invention provides the process to distribute underfill material uniformly and without voids in a flip-chip assembly and thus to minimize the thermomechanical stress in a microelectronic assembly as shown schematically and simplified in FIG. 1. The emphasis of the present invention is on a narrow gap and fine-pitch center-to-center spacing of the bumps, but a portion of the assembly in FIG. 1 is enlarged in FIG. 2 to show some detail of the thin layer structure. An integrated circuit chip 10, preferably formed of silicon, comprises an active surface 11 and an inactive surface 12 which are planar and parallel to each other. A plurality of contact pads 13 are disposed on active surface 11; these contact pads are preferably made of aluminum, copper-doped aluminum, or copper and a combination or refractory metal layer such as titanium or tungsten, and noble metal layer such as palladium, gold, or platinum.

Chip 10 is mounted on a substrate, flexible film, or board 14, integral with interconnections and a plurality of terminal pads 15, yet spaced apart by a gap 16. Substrate 14 preferably comprises a printed circuit board made of FR-4 or a glass-epoxy laminate; contact pads 15 are preferably composed of solder-wettable copper. Chip 10 is attached by reflowable bump interconnections 17 which extend across the gap and connect the terminal pads 13 on the chip to the terminal pads 15 on the substrate both electrically and mechanically. Preferably, tin or a tin alloy (such as tin/indium, tin/bismuth, tin/lead) of a desirable melting temperature is chosen for bumps 17 to accomplish the reflow at a practical temperature. Bumps 17 are often referred to as "solder" bumps. For silicon packages, the protective "soldermask" 19 in FIGS. 1 and 2 can be made of a variety of insulating materials including polymers such as polyimide.

In known technology, the gap 16 is often filled with a polymeric encapsulant that extends over the printed circuit board about the perimeter of the package. The main purpose of encapsulant, commonly referred to as the "underfill" material, is a reduction of mechanical stress in the assembly; another purpose is the protection of the active chip surface. The thermomechanical stress originates from the difference of the coefficient of thermal expansion between silicon and the board material in the process of board assembly (solder bump reflow) and temperature cycling in operation or testing.

Figure 2:
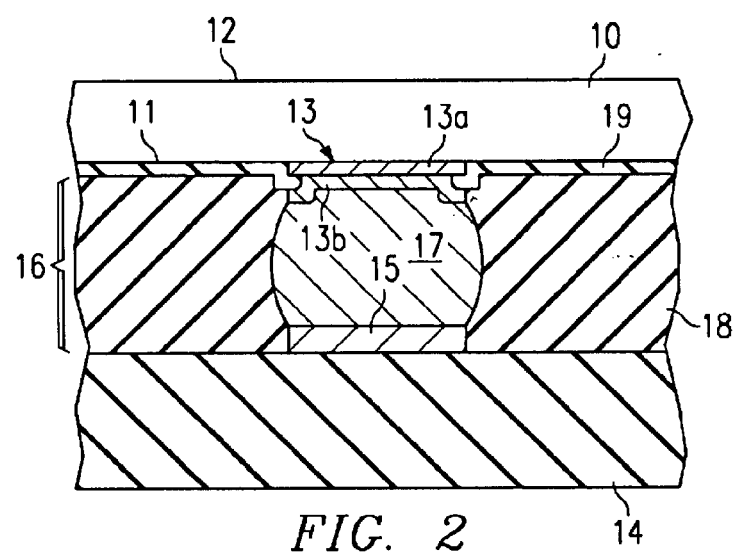
FIG. 2 is an enlargement of a portion of FIG. 1.

Silicon, the preferred semiconductor material of chip 10, has a CTE between 2 and 3 ppm/° C. Typical substrates 14 have a CTE between about 15 and 22 ppm/° C.; and CTEs of the metals in the assembly vary from 4.3 to 17.0. The materials are mechanically coupled intimately, even rigidly, to each other in the assembly of a ball-grid array package. For the standard assembly process flow, the temperature reaches the maximum of 220° C. because of an overshoot over the melting temperature of 183° C. of the eutectic tin-lead alloy (63 weight % tin). After the solder has molten and is beginning to cool, the stress is zero and stays zero to the eutectic temperature of 183° C. With continued cooling of the assembly, though, stress starts appearing and increases rapidly. When ambient temperature is reached, the stress levels reach levels so high that damage by nascent cracking has often been inflicted to the structurally weakest parts of the assembly, especially the solder joints, the chip multilevel dielectric films, or the protective soldermask 19 in FIGS. 1 and 2. The IC chip 10 in FIGS. 1 and 2 is now arranged on substrate 14 such that each of the substrate terminal pads 15 registers with a chip contact pad 13, with the solder bumps therebetween.

Figure 3A:
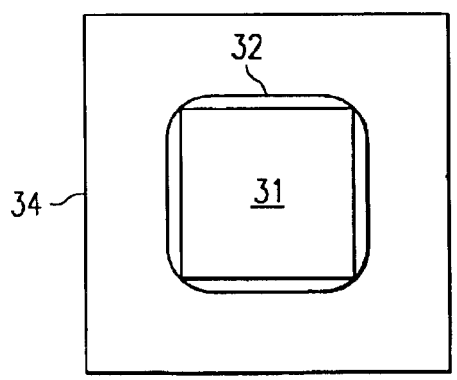
FIG. 3A is a top view of a chip attached to a substrate.
Figure 3B:
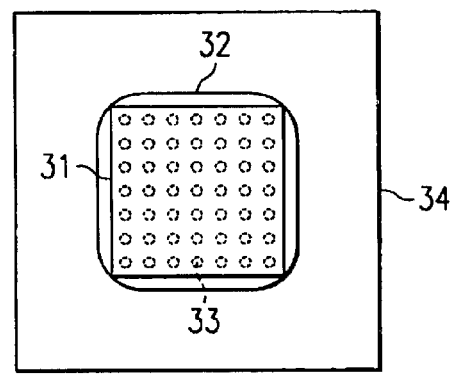
FIG. 3B is an X-ray view of a chip attached to a substrate to see the interconnecting bumps.

The trend in semiconductor technology is towards a rapid increase of the number of "solder" interconnections. FIG. 3A indicates schematically a top view of the passive surface 31 (12 in FIG. 1) of an assembled IC chip 32, and FIG. 3B indicates an X-ray view through this chip 32 in order to show the "solder" bumps 33 connecting chip 32 with substrate 34. For small number of bumps, as illustrated in FIG. 3B, typical dimensions are: Bump diameter between 40 and 160 $\mu$m, center-to-center pitch between 70 and 240 $\mu$m, gap stand-off between 25 and 150 $\mu$m. The number of bumps per chip is expected to increase to the range 100 to 2500.

By way of example, the gap 16 between active surface 11 of the chip and the substrate 14 is typically between 100 and 150 $\mu$m, but is being reduced more and more due to shrinking size of the solder bumps, combined with shrinking pitch center-to-center of the bumps. The trend is in the direction of a gap in the range from 30 to 90 $\mu$m. For this narrow stand-off, most suitable precursors have a strong tendency to leave voids in the filling process.

According to the invention, the propagation, driven by capillary forces, of the underfill precursor through the maze of bumps is supported by the auxiliary means of vibration energy, resulting in a void-free distribution of the underfill precursor. The vibration energy is created by a vibration motor, which is attached to the platform loaded with the flip-chip assemblies; these assemblies are positioned to receive the underfill precursor by means of a dispenser. The vibrations are transmitted from the motor through the platform (and/or tray) to the flip-chip assemblies.

The vibration energy may involve frequencies from 50 Hz to 25 kHz (frequencies beyond 20 kHz are in the ultrasonic regime), and amplitudes from 1 $\mu$m to 1 mm. As the preferred energy selection, according to the invention, the vibration frequency ranges from 120 Hz 1000 Hz, and the vibration amplitude from 1 $\mu$m to 100 $\mu$m.

The manufacturing arrangement is shown schematically in FIG. 4. A metal tray 47 holds the flip-chip packages 40. Tray 47, in turn, is held onto a platform 48 by vacuum channels 48a. Platform 48 has a vibration motor 49 attached so that vibration energy can propagate through the platform 48, tray 47 to the flip-chip packages 40. This transmission ensures controllable vibration energy for packages 40 during the underfill process.

As FIG. 4 indicates, a plurality of chips 40a with solder balls 40b and substrates 41 are placed on tray 47. A syringe 42 with a single nozzle 43 is placed adjacent to the perimeter of chip 40a. The polymeric precursor 44 is dispensed under slight pressure so that a drop 45 is formed at the nozzle.

After separation of the drop, a bead is applied along the chip perimeter. With the substrate 41 preheated, the precursor is drawn into the gap between chip 40a and substrate 41 by capillary forces. One or more drops of polymeric precursor will thus form fillet 46 for the assembly. Thereafter, capillary 42 is moved over to the next chip and substrate in order to produce the next assembly.

Figure 5:
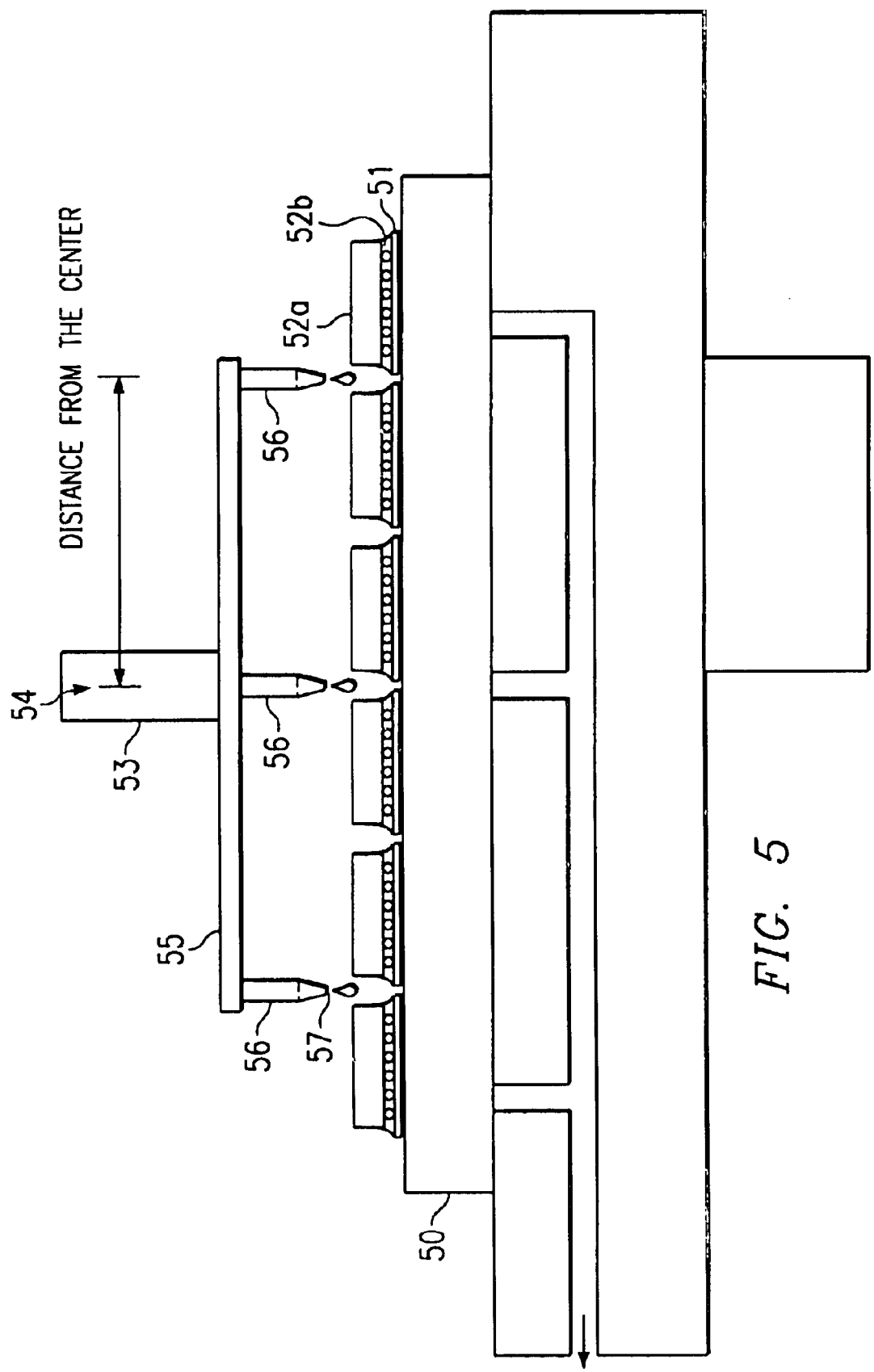
FIG. 5 shows schematically a multi-nozzle dispensing apparatus for underfilling assemblies at uniform rate.

An improved modification has been described in the above cited U.S. Pat. No. 6,245,583 and is schematically shown in FIG. 5. A controllably heatable tray 50 can receive and hold a multitude of substrates 51. Each substrate is made of electrically insulating material and has a plurality of interconnecting wiring strips and a pattern of metal terminal pads. Over each substrate is aligned a semiconductor integrated circuit chip 52a. Each chip 82a has a pattern of metal contact pads mirror-imaging the pattern of the terminal pads on the substrates 51, and one solder ball 52b attached to each contact pad. Chips 52a with solder balls 52b are aligned to the respective substrates such the solder balls are positioned on the respective substrate terminal pads.

Thermal energy is supplied to and later withdrawn from the chips and substrates. When the solder balls 52b have reached their melting temperature (183° C. for eutectic lead-tin mixtures), their reflow is controlled so that their resulting height defines a gap spacing chip and substrate apart (for instance, 100 $\mu$m). The assembly is cooled so that the solder solidifies, but the assembly remains at a temperature between 90 and 130° C. A preferred temperature is approximately 100° C. At this temperature, mechanical stress in the assembly remains at low values, well below any risk for introducing cracks in weak structures such as solder joints and dielectric films.

An apparatus for multiple controlled dispensing of polymeric precursor is moved over the assembly as shown in FIG. 5. This apparatus consists of a center supply line or feed tube 53, through which the polymeric precursor or any other deformable medium 54 is supplied under slight pressure. A header 55 is connected to the center feed tube 53 and a plurality of distribution tubes 56. FIG. 5 shows an example of three distribution tubes, but any number can be arranged. Each distribution tube 56 acquires a predetermined well-defined distance from the center of feed tube 53. At the end of each distribution tube 56 is a nozzle 57.

It is important that the cross section of each nozzle 57 is correlated to the distance of the respective distribution tube 56 from the center line of the center feed tube 53. The nozzles have increasingly larger cross sections, the farther the respective distribution tube is positioned from the center tube. This feature ensures that the dispense rate, of the polymeric precursor or any other deformable medium 54 can be kept the same for all distribution tubes. This condition is, of course, essential for a mass production method.

It is advantageous to construct the multiple-nozzle dispensing equipment such that the distribution nozzles are positioned in the repetitive distances ("pitch") of the chips-on-substrates aligned in a row for underfilling. An example is shown in FIG. 5 where the distribution nozzles are positioned so that every other chip can be served in one dispensing operation. After completing the underfilling of the first group of chips-on-substrates, the dispensing equipment is advanced in lockstep with the pitch of the aligned product, and the next group can be underfilled. In this fashion, even large numbers of product can be assembled in short time for mass production.

Figure 6:
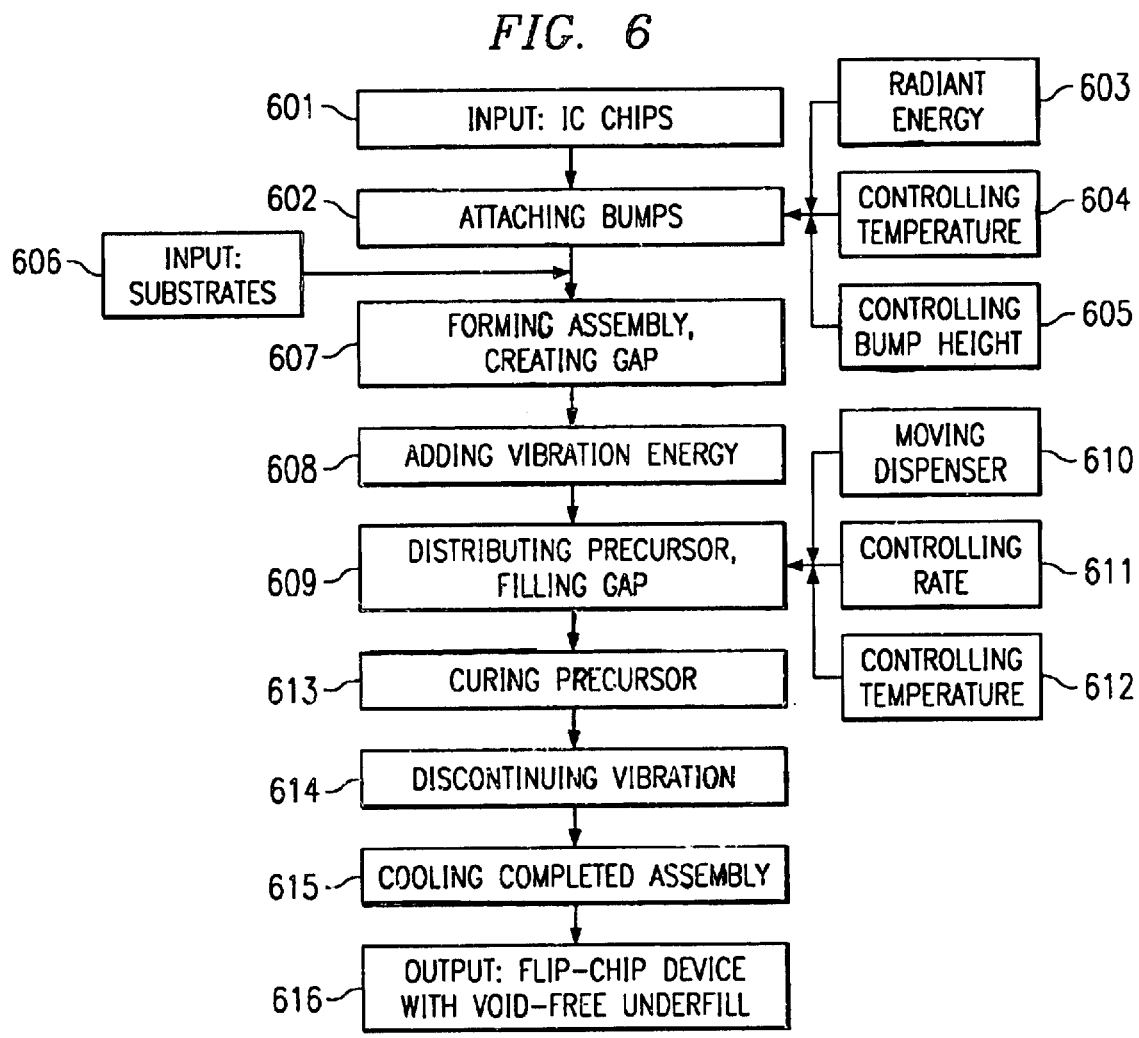
FIG. 6 is a block diagram of the process flow for the void-free underfilling method using vibration energy.

The block diagram of FIG. 6 depicts the process flow of the vibration-assisted fabrication method for underfilling flip-chip electronic devices, thus completing an electronic assembly with void-free underfill.

Step 601: First Input: Providing an integrated circuit chip having a first plurality of metallic contact pads exposed; the contact pads have a pitch center-to-center of less than 180 $\mu$m;

Step 602: attaching a metallic bump to each of the contact pads, the bumps made of reflowable metal; the preferred method of attaching the bumps includes:

Step 603: supplying radiant energy to the substrate and said chip to achieve specific profiles of temperature cycling;

Step 604: measuring and controlling temperature; and

Step 605: controlling the height of the metallic bumps to maintain a uniform gap of spacing the chip and the substrate apart.

Step 606: Second Input: Providing an electrically insulating substrate having a second plurality of metallic terminal pads in locations matching the locations of the contact pads;

Step 607: attaching bumps to the matching terminal pads, respectively, thereby interconnecting the chip with the substrate, spaced apart by a gap;

Step 608: adding vibration energy to the electronic assembly, while performing Step 609. The vibration energy comprises frequencies between about 50 Hz and ultrasonic frequencies of 25 kHz, and amplitudes between about 1.0 $\mu$m and 1,0 mm. Preferably, the vibration energy comprises frequencies between about 120 and 1000 Hz, and amplitudes between about 1.0 and 100$\mu$;

Step 609: filling the gap uniformly with an adherent polymeric precursor, whereby the precursor absorbs the vibration energy to eliminate voids from the precursor, to distribute fillers equally, and to ensure uniform adhesion of said precursor; the preferred method of filling the gap comprising:

Step 610: moving the dispenser in multiple independent degrees of freedom;

Step 611: controlling the dispensing rate of the precursor. The dispensing rate is controlled by a dispenser having multiple distribution tubes with nozzles of cross sections increasingly larger with increasing distance of the distribution tube from the center supply line.

Step 612: measuring and controlling temperature during the dispensing process.

Step 613: Increasing the temperature of the assembly to supply thermal energy for curing the polymeric precursor, whereby a polymeric encapsulant free of voids is formed;

Step 614: discontinuing said vibration energy;

Step 615: cooling the completed assembly to room temperature; and

Step 616: Output: Electronic flip-chip devices with void-free underfill.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the method disclosed can be applied to void-free filling of gaps between any substrates or other external parts which are interconnected by elements in need of stress-relief during thermomechanical stress. As another example, the method can generally be applied to fabricate void-free fillings between solid parts. It is, therefore, intended that the appended claims encompass any such modifications or embodiments.

We claim:

1. A method for completing an electronic assembly, comprising the steps of:
- providing an integrated circuit chip having a first plurality of metallic contact pads exposed, said contact pads having a pitch center-to-center of less than 180 μm;
- attaching a metallic bump to each of said contact pads, said bumps made of reflowable metal;
- providing an electrically insulating substrate having a second plurality of metallic terminal pads in locations matching the locations of said contact pads;
- attaching said bumps to said matching terminal pads, respectively, thereby interconnecting said chip with said substrate, spaced apart by a gap; and
- adding vibration energy to said electronic assembly, while filling said gap uniformly with an adherent polymeric precursor, whereby said precursor absorbs said vibration energy to eliminate voids from said precursor, to distribute fillers equally, and to ensure uniform adhesion of said precursor;
- increasing the temperature of said assembly to supply thermal energy for curing said polymeric precursor;
- discontinuing said vibration energy; and
- cooling the completed assembly to room temperature.

2. The method according to claim 1 wherein said vibration energy comprises frequencies between about 50 Hz and ultrasonic frequencies of 25 kHz, and amplitudes between about 1.0 μm and 1.0 mm.

3. The method according to claim 1 wherein said vibration energy comprises frequencies between about 120 Hz and 1000 Hz, and amplitudes between about 1.0 and 100 μm.

4. The method according to claim 1 wherein said step of attaching said bumps to said terminal pads comprises:
- supplying radiant energy to said substrate and said chip to achieve specific profiles of temperature cycling;
- measuring and controlling temperature; and
- controlling the height of said metallic bumps to maintain a uniform gap of spacing said chip and said substrate apart.

5. The method according to claim 1 wherein said step of filling is performed using a dispenser comprising:
- means for moving in multiple independent degrees of freedom;
- means for controlling the dispensing rate of said precursor; and
- means for measuring and controlling temperature during the dispensing process.

6. The method according to claim 1 wherein said dispensing rate is controlled by a dispenser having multiple distribution tubes with nozzles of cross sections increasingly larger with increasing distance of said distribution tube from the center supply line.

* * * * *